(12) United States Patent
Kohyama

(10) Patent No.: US 6,506,634 B1
(45) Date of Patent: Jan. 14, 2003

(54) SEMICONDUCTOR MEMORY DEVICE AND METHOD FOR PRODUCING SAME

(75) Inventor: Yusuke Kohyama, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 384 days.

(21) Appl. No.: 09/589,124

(22) Filed: Jun. 8, 2000

Related U.S. Application Data

(62) Division of application No. 09/371,535, filed on Aug. 10, 1999, now Pat. No. 6,094,386.

(30) Foreign Application Priority Data

Aug. 13, 1998 (JP) .......................................... 10-229186
Jul. 23, 1999 (JP) .......................................... 11-209065

(51) Int. Cl.$^7$ .............................................. H01L 21/82
(52) U.S. Cl. ................................ 438/132; 138/14; 138/4
(58) Field of Search ................................ 438/4, 14, 18, 438/132; 148/DIG. 55

(56) References Cited

U.S. PATENT DOCUMENTS

| | | | | |
|---|---|---|---|---|
| 4,849,939 A | * | 7/1989 | Muranaka et al. | 365/200 |
| 5,471,426 A | | 11/1995 | McClure | 365/225.7 |
| 5,579,265 A | * | 11/1996 | Devin | 365/185.07 |
| 5,590,085 A | | 12/1996 | Yuh et al. | 365/225.7 |
| 5,602,777 A | * | 2/1997 | Nawaki et al. | 365/185.09 |
| 5,680,354 A | * | 10/1997 | Kawagoe | 365/200 |

FOREIGN PATENT DOCUMENTS

| | | |
|---|---|---|
| JP | 1-308407 | 12/1989 |
| JP | 4-260353 | 9/1992 |
| JP | 6-5707 | 1/1994 |
| JP | 6-302701 | 10/1994 |

\* cited by examiner

Primary Examiner—Trung Dang
(74) Attorney, Agent, or Firm—Banner & Witcoff, Ltd.

(57) ABSTRACT

A semiconductor memory device comprises: a memory cell array including memory cells arranged in the form of a matrix; a redundant cell array including redundant cells arranged for relieving a defective memory cell of the memory cell array; a defective address memory circuit including first and second memory circuits using different programming methods for storing an address of the defective memory cell of the memory cell array; and a substitution control circuit for controlling the substitution of one of the redundant cells of the redundant cell array for the defective memory cell of the memory cell array on the basis of memory data of the defective address memory circuit. Thus, it is possible to provide a semiconductor memory device capable of reducing the area occupied by a defective address memory circuit and surely carrying out defect relief, and a method for producing the same.

4 Claims, 9 Drawing Sheets

SEMICONDUCTOR MEMORY DEVICE AND METHOD FOR PRODUCING SAME

This application is a divisional of prior application Ser. No. 09/373,535 filed Aug. 10, 1999, now U.S. Pat. No. 6,094,386.

BACKGROUND OF THE INVENTION

1. Field of the Invention

The present invention relates generally to a semiconductor memory device of a redundant circuit system, and a method for producing the same.

2. Description of the Related Art

Semiconductor memory devices, particularly DRAMs, are scaled down and large-scale-integrated year by year. With such scale down and large scale integration, it become more and more difficult to hold the same yield as those of the last generation DRAMs. Therefore, in recent years, there is adopted a redundant circuit system for arranging a redundant cell array (an auxiliary cell array) for a memory array to substitute a redundant cell for a defective cell to carry out defect relief.

In a conventional redundant circuit technique, a fuse circuit capable of being cut (blown) by laser a is typically used as a defective address memory circuit. Specifically, a defective cell is identified by carrying out the die sort in the stage of a semiconductor wafer, on which a plurality of DRAM circuits have been integrated. On the basis of the defective address data, a corresponding fuse is cut by a laser blowing machine. Thereafter, the wafer is divided into DRAM chips, each of which is sealed in a package to carry out the final inspection thereof.

In the conventional redundant circuit technique using the laser blow, there are the following problems. First, if the scale of the DRAM increases by four, the scale of the fuse circuit for storing the defective address also increases by four, so that the throughput of the laser blow decreases to one-fourth. Secondly, since the pitch of the fuse array is determined by the capacity of the laser blowing machine, even if the DRAM has a fine design rule of 0.25 to 0.35 $\mu$m, the pitch of the fuse array can not be 3 to 4 $\mu$m or less. This means that the area occupied by the fuse array in the DRAM chip relatively increases every DRAM generation.

As a fuse element of a semiconductor integrated circuit other than the fuse element of the system capable of being cut by the laser blow, there are also known systems using an electric fuse capable of being electrically cut or short-circuited (e.g., see Japanese Patent Laid-Open No. 6-5707 and No. 6-302701), and a system using a mechanical fuse capable of being cut by etching (e.g., Japanese Patent Laid-Open No. 1-308047). If these fuses are used, the fuse array can be scaled down.

However, in a case where the electric fuse is used, if the scale of the fuse array becomes large, the scale of surrounding circuits, such as a signal generating circuit required for programming the fuse array, also becomes large. Therefore, there is some possibility that the area occupied by the defective address memory circuit including the fuse array and the surrounding circuits thereof is substantially equal to that when the fuse of the laser blow system is used. In addition, in a case where the mechanical fuse capable of being cut by etching is used, a programming step is carried out at least before a passivation step for a semiconductor wafer is completed, so that it is not possible to relieve a defective cell when the defective cell is produced at the subsequent step.

SUMMARY OF THE INVENTION

It is therefore an object of the present invention to eliminate the aforementioned problems and to provide a semiconductor memory device capable of reducing the area occupied by a defective address memory circuit and surely carrying out defect relief, and a method for producing the same.

In order to accomplish the aforementioned and other objects, according to one aspect of the present invention, a semiconductor memory device comprises: a memory cell array including memory cells arranged in the form of a matrix; a redundant cell array including redundant cells arranged for relieving a defective memory cell of the memory cell array; a defective address memory circuit including first and second memory circuits using different programming methods for storing an address of the defective memory cell of the memory cell array; and a substitution control circuit for controlling the substitution of one of the redundant cells of the redundant cell array for the defective memory cell of the memory cell array on the basis of memory data of the defective address memory circuit.

Preferably, the first memory circuit comprises a first fuse circuit including mechanical fuses capable of being cut by a reactive ion etching, and the second memory circuit comprises a second fuse circuit including electric fuses capable of being electrically cut or short-circuited.

The memory cell array may include a MOS transistor arranged on a semiconductor substrate, a capacitor connected to one of source and drain diffusion layers of the MOS transistor, and a signal wiring formed on the semiconductor substrate via an interlayer insulator film. In this case, the mechanical fuses of the first fuse circuit are preferably formed of the same wiring material film as that of the signal wiring of the memory cell array.

The signal wiring may have a multi-layer structure. In this case, the mechanical fuses of the first fuse circuit are preferably formed of the same material film as that of the uppermost layer wiring of the signal wiring.

Alternatively, when the memory cell array includes a MOS transistor arranged on a semiconductor substrate, a capacitor connected to one of source and drain diffusion layers of the MOS transistor, and a signal wiring formed on the semiconductor substrate via an interlayer insulator film, then the electric fuses of the second fuse circuit are preferably anti-fuses having a capacitor structure, which are formed of the same material as that of the capacitor of the memory cell array and which are formed at the same time that the capacitor of the memory cell array is formed.

Preferably, the first fuse circuit capable of being cut by the reactive ion etching has a larger scale than that of the second fuse circuit capable of being electrically cut or short-circuited.

According to another aspect of the present invention, a semiconductor memory device comprises: a memory cell array including memory cells arranged in the form of a matrix; a redundant cell array including redundant cells arranged for relieving a defective memory cell of the memory cell array; a defective address memory circuit including a memory circuit, which includes mechanical fuses capable of being cut by a reactive ion etching, for storing an address of the defective memory cell of the memory cell array; and a substitution control circuit for controlling the substitution of one of the redundant cells of the redundant cell array for the defective memory cell of the memory cell array on the basis of memory data of the defective address memory circuit.

According to a further aspect of the present invention, a method for producing a semiconductor memory device., comprises: a memory producing step of integrating and forming a memory circuit having a defective address memory circuit, which includes a first fuse circuit wherein mechanical fuses capable of being cut by a reactive ion etching are arranged, and a second fuse circuit wherein electrically fuses capable of electrically cut or short-circuited are arranged; a first programming step of carrying out a first defect analyzing test for the memory circuit and selectively cutting a corresponding fuse of the first fuse circuit by the reactive ion etching in accordance with the result of the first defect analyzing test; and a second programming step of carrying out a second defect analyzing test for the memory circuit and selectively cutting or short-circuiting a corresponding fuse of the second fuse circuit by applying an electric signal thereto in accordance with the result of the second defect analyzing test.

In this producing method, the first fuse circuit is preferably formed below a passivation film of a semiconductor wafer, on which the memory circuit is formed, and the first programming step is preferably carried out before forming the passivation film.

Preferably, the first programming step comprises the steps of: patterning and forming a resist on a surface, on which the first fuse circuit of the semiconductor wafer is formed, by a lithography using the direct writing; and selectively etching a corresponding fuse of the first fuse circuit by a reactive ion etching using the patterned and formed resist as a mask.

The second programming step is preferably carried out after the memory circuit is divided into chips to be mounted on packages.

According to the present invention, the defective address memory circuit comprises two kinds of memory circuits using different programming methods, so that it is possible to decrease the area occupied by the defective address memory circuit and carry out defect relief. For example, the first memory circuit comprises the first fuse circuit including the mechanical fuses capable of being cut by the reactive ion etching, and the second memory circuit comprises the second fuse circuit including the electric fuses capable of being electrically cut or short-circuited. In this case, the first fuse circuit can have fuses arranged in a fine pitch, so that it is not required to provide any surrounding circuits particularly used for programming. Therefore, if the principal part of the defective address memory circuit comprises the first fuse circuit, it is possible to decrease the area occupied by the defective address memory circuit.

Although there is some possibility that a defective cell occurs after the step of programming the first fuse circuit, the defect relieving efficiency is high if the defective cell is finally relieved by the electric programming of the second fuse circuit. If the defect relief is carried out by the first fuse circuit, the probability that a defective cell occurs thereafter is low, so that the scale of the second fuse circuit can be small.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Referring now to the accompanying drawings, the preferred embodiment of the present invention will be described below.

Figure 1:
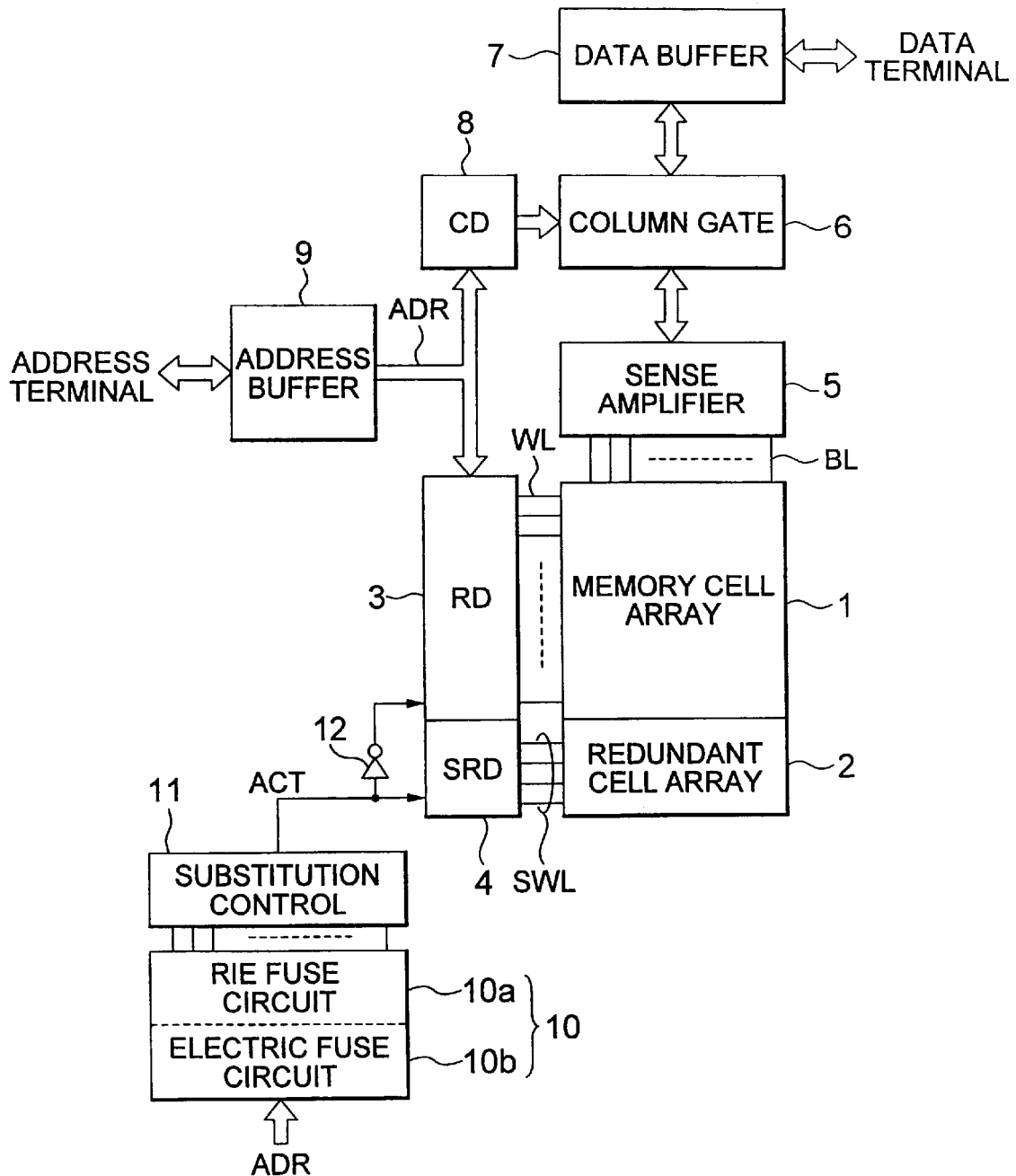
FIG. 1 is a block diagram of a preferred embodiment of a semiconductor memory device according to the present invention.

FIG. 1 shows the block construction of a preferred embodiment of a DRAM according to the present invention. A memory cell array 1 comprises well-known dynamic memory cells, each of which comprises a MOS transistor and a capacitor and which are arranged in the form of a matrix. A redundant cell array 2 for relieving a defective cell is arranged for the memory cell array 1.

In this preferred embodiment, the redundant cell array 2 comprises a plurality of spare word lines SWL, each of which is substituted for a defective word line of the word lines WL of the memory cell array 1. The word lines WL of the memory cell array 1 are selectively driven by a row decoder 3, and the spare word lines SWL of the redundant cell array 2 are selectively driven by a spare row decoder 4. To the row decoder 3 and the spare row decoder 4, a row address of addresses incorporated by an address buffer 9 is supplied.

In order to substitute the spare word line SWL, the number of which is smaller than the number of the word lines, for the defective word line WL, it is required to obtain information which range of word lines WL in the memory cell array 1 is relieved by each of the spare word lines SWL of the redundant cell array 2. This has been determined at a design stage. That is, an address corresponding to each of relief ranges obtained by dividing the plurality of word lines WL into groups is assigned to each of the spare word lines SWL. This is supplied to the spare row decoder 4.

A sense amplifier 5 is connected to bit lines BL of the memory cell array 1. The sense amplifier 5 senses readout data, and stores writing data therein. The bit lines are selected by a column decoder 8 for decoding a column address and a column gate 6 selectively driven by the column decoder 8. The sense amplifier 5 is connected to a data buffer 7 via the column gate 6. The data buffer 7 is connected to an external data terminal.

In order to substitute the spare word line SWL of the redundant cell array 2 for the defective word line of the memory cell array 1, a defective address memory circuit 10 is provided. The defective address memory circuit 10 comprises two kinds of fuse circuits 10a and 10b. The first fuse circuit 10a is a circuit (which will be hereinafter referred to as a RIE fuse circuit) wherein mechanical fuses capable of being cut by the reactive ion etching (RIE) are arranged. The second fuse circuit 10b is a circuit (which will be hereinafter referred to as an electric fuse circuit) wherein electric fuses capable of being electrically cut or short-circuited are arranged.

To both of the RIE fuse circuit 10a and the electric fuse circuit 10b, an address incorporated by the address buffer 9 is inputted. A programming is made on the basis of the test results so that an equality detection output is produced when the input address is a defective address. When the equality detection output is obtained, a substitution control circuit 11 controls the substitution of a spare word line for a defective word line. The substitution control circuit 11 produces a substitution activation output ACT on the basis of the equality detection output of the defective address memory circuit 10, so that the spare row decoder becomes active. The substitution activation output ACT deactivates the row decoder 3 via an inverter 12.

In this preferred embodiment, a principal part of the address memory circuit 10 is the RIE fuse circuit 10a. As will be described in detail later, the relief processing for the memory cell defect is carried out by the RIE fuse circuit 10a at a step near the final stage of a process for producing a DRAM. In order to cope with a defect which may occur at the subsequent step although its probability is low, the electric fuse circuit 10b is used.

Figure 2:
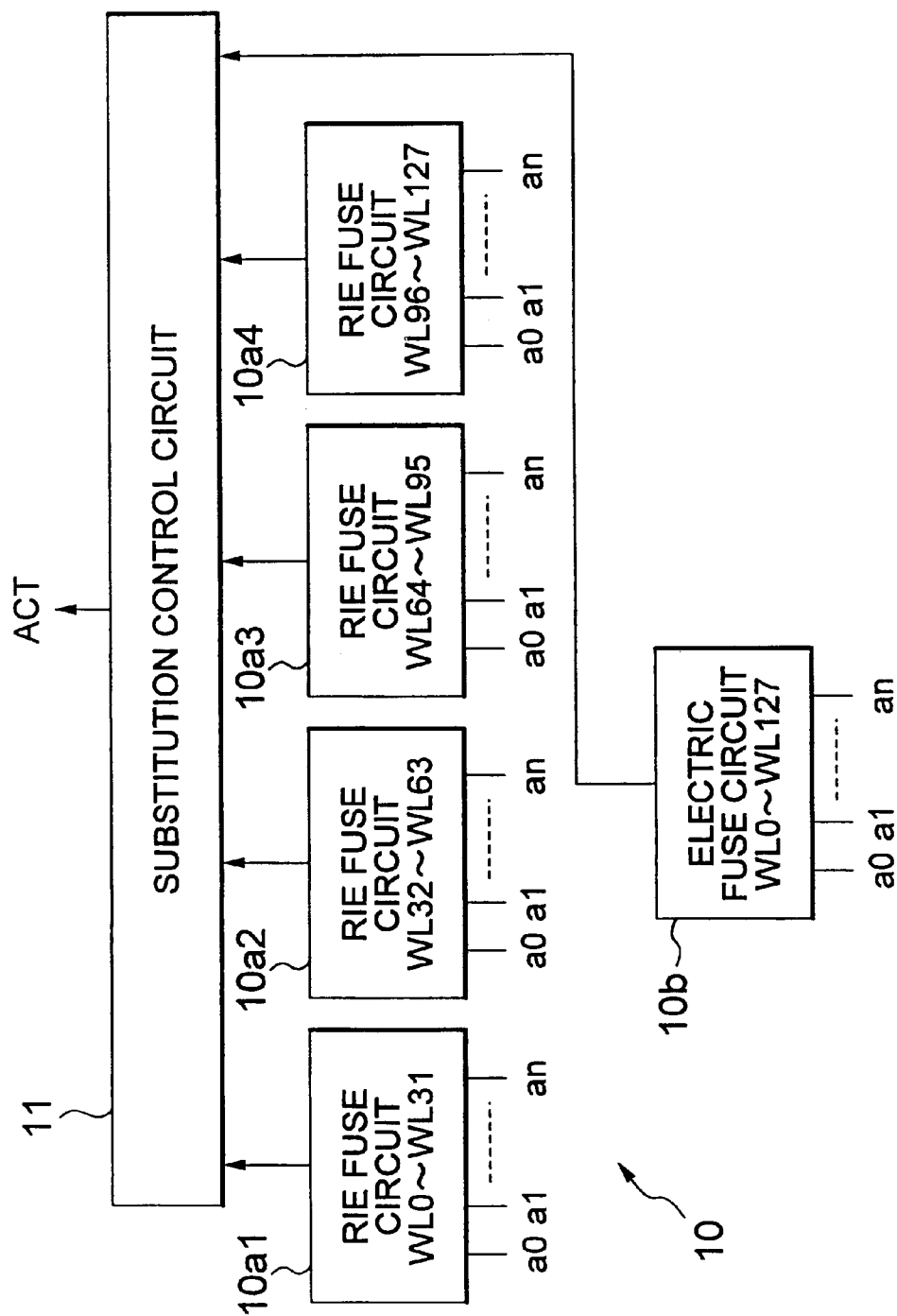
FIG. 2 is a block diagram of a defective address memory circuit in the preferred embodiment shown in FIG. 1.

Referring to a numerical example, this preferred embodiment will be described. For example, it is assumed that 5 spare word lines SWL are prepared with respect to 128 word lines, WL of a certain range of the memory cell array 1. In this case, the 128 word lines WL are divided into four relief units, each of which has 32 word lines. Four of the five spare word lines SWL are assigned to be substituted for a defective word line of each of the relief units. This is a main defect relief. In order to achieve this, as shown in FIG. 2, four RIE fuse circuits 10a1 through 10a4, each of which covers the range of the 32 word lines WL, are provided.

The remaining one of the spare word lines SWL is capable of additionally relieving only one defect in the range of the 128 word lines, which occurs after the relief processing carried out by the RIE fuse circuit 10a. In order to substitute this one spare word line SWL, one electric fuse circuit 10b for covering the range of the 128 word lines is prepared as shown in FIG. 2.

All of address bits a0 through an are inputted to each of the fuse circuits 10a1 through 10a4 and 10b, and an equality detection output is produced in accordance with a certain different defective address. Therefore, the substitute control circuit 11 may derive an OR logic of these equality detection outputs to output an activation output ACT.

Figure 3:
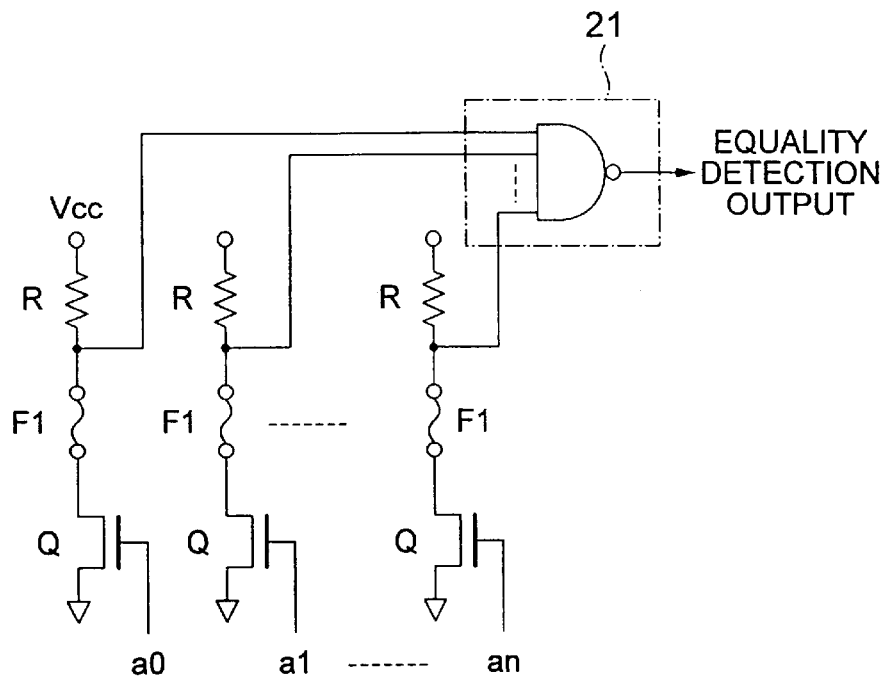
FIG. 3 is a circuit diagram showing the detailed construction of a RIE fuse circuit shown in FIG. 2.

FIG. 3 shows an equivalent circuit of the RIE fuse circuit 10a. As shown in this figure, an inverter per each address, wherein a load resistance R, a RIE fuse F1 and an NMOS transistor Q for selection, to the gate of which an address is input, are connected in series, is provided between a power supply VCC and a ground VSS. The RIE fuse F1 is cut in accordance with a defective address so that all of the outputs (fuse data) of the respective inverters have "1". In order to detect the all "1" state, an equality detection circuit 21 using a NAND gate is provided, for example. In the example of FIG. 2, the four fuse circuits shown in FIG. 3 are prepared.

Figure 4:
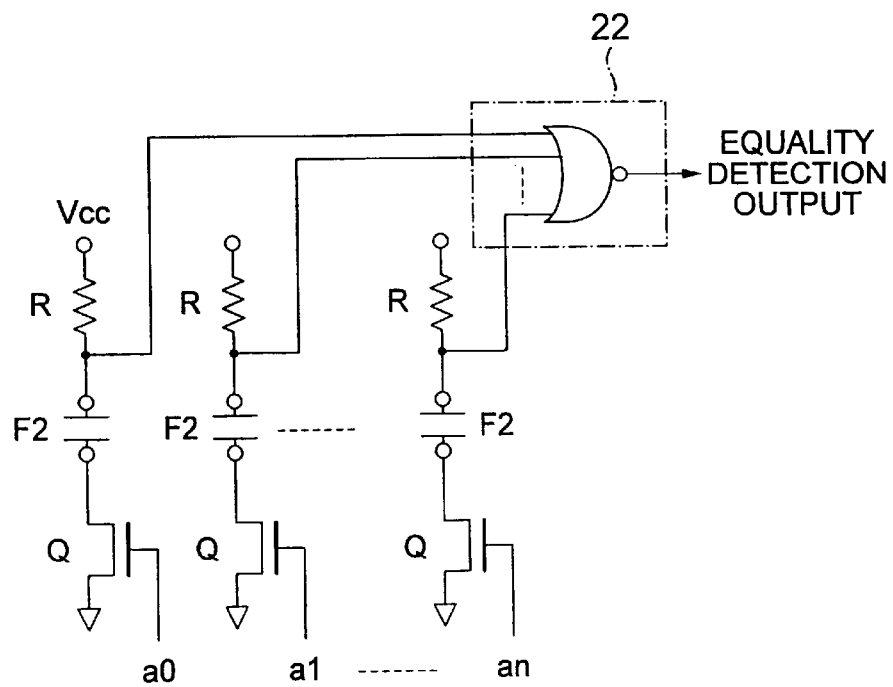
FIG. 4 is a circuit diagram showing the detailed construction of an electric fuse shown in FIG. 2.

FIG. 4 shows an equivalent circuit of the electric fuse circuit 10b. The construction and principle of the circuit is the same as those of the RIE fuse circuit 10a. That is, an inverter per each address, wherein a load resistance R, an electric fuse F2 of a capacitor and an NMOS transistor Q for selection, to the gate of which an address is input, are connected in series, is provided between a power supply VCC and a ground VSS. In order to detect the all "0" state of the outputs of the respective inverters, an equality detection circuit 22 is provided. The electric fuse F2 shown in FIG. 4 is designed so that the capacitor serving as a component is broken to be in a conducting state when a high voltage is applied from the outside.

Furthermore, in most of actual defective address memory circuits, fuse circuits programmed for defect relief and unused fuse circuits are mixed, so that it is required to identify these fuse circuits. In order to generate identification signals, an enable fuse (not shown) is usually used.

A process for producing the preferred embodiment of a DRAM according to the present invention, which includes the defect relief processing for the DRAM, will be described in detail below. In the following example, the DRAM has a stacked capacitor structure, and the RIE fuse F1 of the RIE fuse circuit 10a capable of being mechanically cut is made of a wiring material of the uppermost wiring element of the DRAM. The electric fuse F2 of the electric fuse circuit 10b is an anti-fuse which is formed of the same material as that of the capacitor of the DRAM at the same time that the capacitor of the DRAM is formed.

Figure 5:
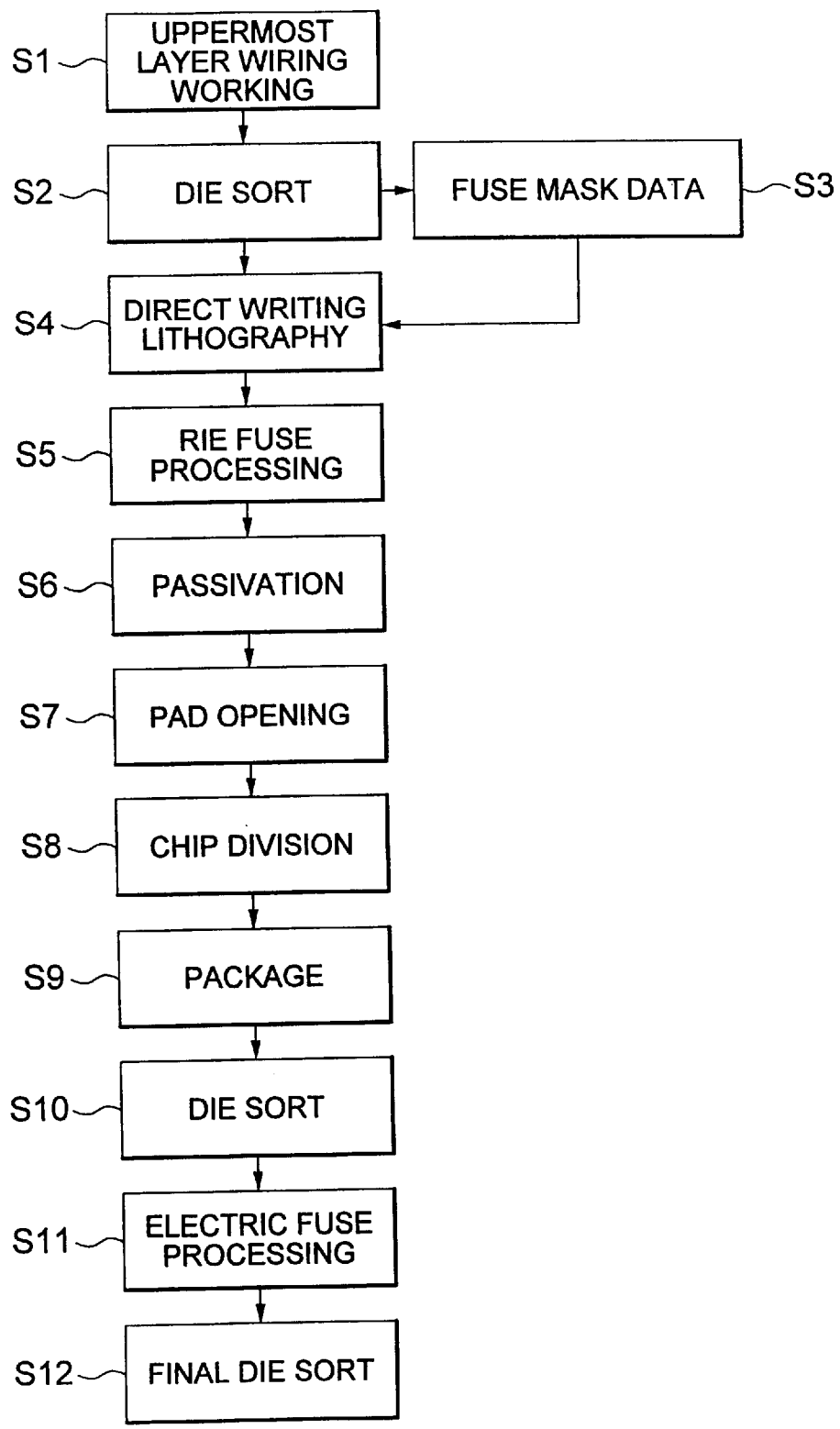
FIG. 5 is a flow chart showing steps after an uppermost layer wiring step of a DRAM producing process in a producing method according to the present invention.
Figure 6:
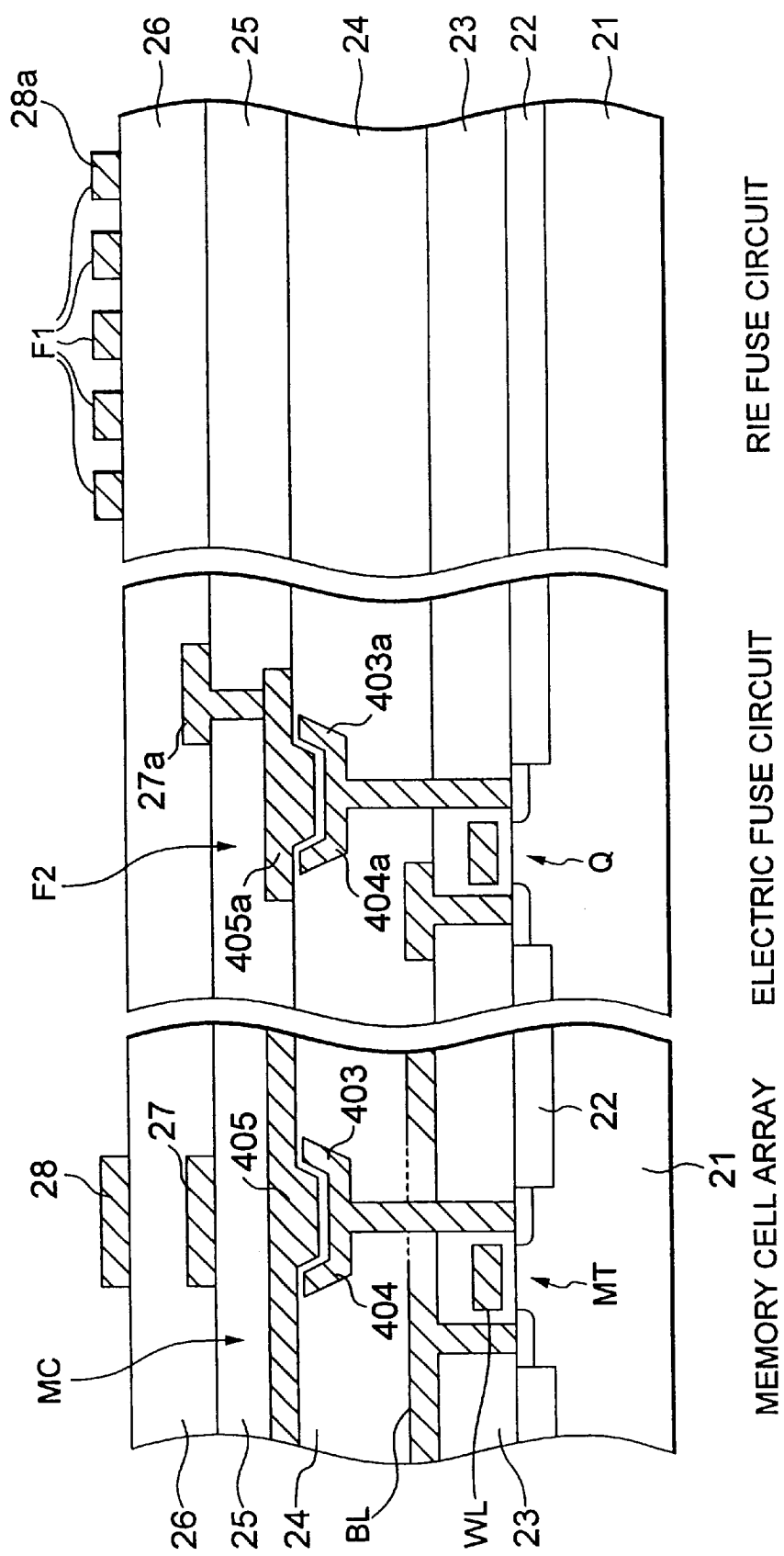
FIG. 6 is a sectional view of a semiconductor device after the uppermost layer wiring forming step in the producing method according to the present invention.

FIG. 5 shows the flow of steps after a step S1 of working the uppermost wiring element in a process for producing a DRAM. FIG. 6 shows a schematic sectional structure of each of parts at the step S1 of working the uppermost wiring element. In the memory cell array region of a semiconductor wafer wherein an element isolating insulator film 22 has been formed on a silicon substrate 21, a MOS transistor MT and a capacitor MC, which constitute a dynamic memory cell having the stacked capacitor structure, are laminated. The gate electrode of the MOS transistor MT serves as a word line WL. The MOS transistor MT is covered with an interlayer insulator film 23. A bit line BL connected to one of the source and drain diffusion layers of the MOS transistor MT is provided thereon. The top of the bit line BL is covered with an interlayer insulator film 24. On the interlayer insulator film 24, a capacitor MC connected to the other diffusion layer of the MOS transistor MT is formed.

Figure 7:
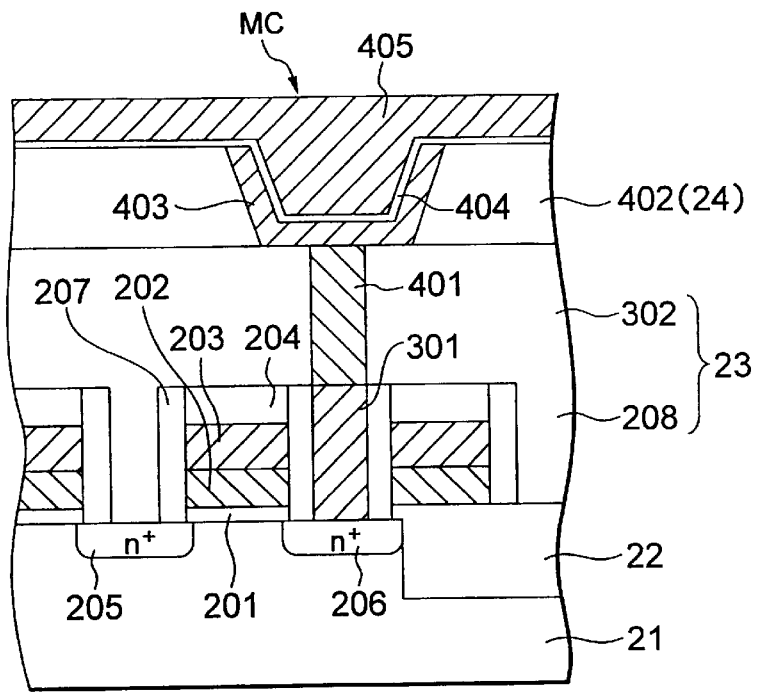
FIG. 7 is a sectional view showing the structure of a capacitor contact part in a memory cell array region of a semiconductor memory device according to the present invention.
Figure 8:
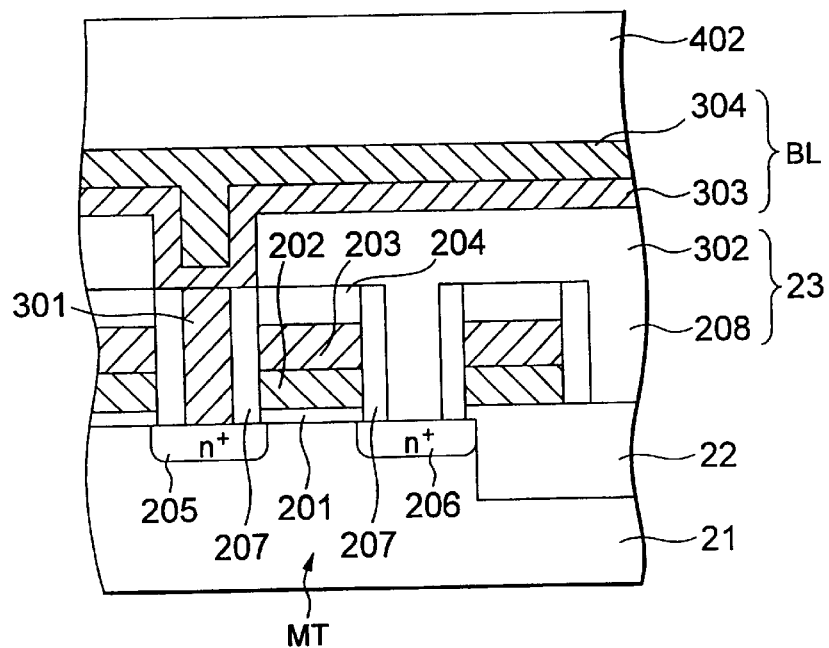
FIG. 8 is a sectional view showing the structure of a bit-line contact part in a memory cell array region of a semiconductor memory device according to the present invention.

FIGS. 7 and 8 show the detailed structure of the above described memory cell part comprising the MOS transistor MT and the capacitor MC. In FIG. 6, a position, at which the bit line BL contacts the diffusion layer of the MOS transistor, is actually displaced from a position, at which the capacitor MC contacts the diffusion layer of the MOS transistor, in a direction perpendicular to the plane of FIG. 6. FIG. 7 shows a cross section at the contact position of the capacitor MC, and FIG. 8 shows a cross section at the contact position of the bit line BL.

Referring to FIGS. 7 and 8, a process for producing a memory cell will be described in detail below. First, a gate oxide film 201 having a thickness of about 6 nm is formed in an element forming region surrounded by the element isolating insulator film 22. On the gate oxide film 201, a polycrystalline silicon film 202 having a thickness of about 100 nm, a tungsten film 203 having a thickness of about 50 nm and a silicon nitride film 204 having a thickness of about 150 nm are sequentially deposited. These deposited films are patterned to form a gate electrode (a word line WL).

Then, As is ion-implanted at an acceleration voltage of 20 KeV and a dose of $5 \times 10^{13}/cm^2$ to form source and drain diffusion layers 205 and 206. Subsequently, a silicon nitride film 207 having a thickness of about 30 nm is deposited on the whole surface to be etched back to form a side wall on the side of the gate electrode. Thereafter, a BPSG (Boron Phosphorus Silicate Glass) film 208 is deposited on the whole surface to flatten the surface thereof by the chemical mechanical polishing (CMP) method using the silicon nitride film 204 on the gate electrode as a stopper.

Then, a resist pattern (not shown) is formed, and the BPSG film 208 is self-aligningly patterned on the gate electrode using a RIE having an etch selectivity of BPSG film/silicon nitride film of 20 or more. After the resist is removed, a polycrystalline silicon, into which an n-type impurity has been doped, is deposited to be flattened by the CMP method using the silicon nitride film and the BPSG film as stoppers to form an embedded polycrystalline plug 301.

Thereafter, a BPSG film 302 is deposited again. In this BPSG film 302, bit-line contact holes and bit-line embedding grooves are formed by the dual damascene method. In these grooves, bit lines BL are embedded. Specifically, the bit lines are embedded by laminating a barrier metal 303 having a thickness of about 20 nm and a tungsten film 304 having a thickness of about 200 nm and flattening the laminated films by the CMP using the BPSG film 302 as a stopper.

Thereafter, a part of the top of the embedded bit line BL is etched to form a groove (not shown) to embed a silicon nitride film (not shown) therein to form a cap of the silicon nitride film on the bit line BL. Subsequently, the BPSG film 302 is self-aligningly patterned on the bit line BL by the RIE having an etch selectivity of BPSG/silicon nitride film of 20 or more to form a capacitor contact hole, and a flat contact conductor 401 of barrier metal/tungsten is embedded on the exposed polycrystalline plug 301.

Then, an interlayer insulator film 402 is deposited, and a recessed portion is formed in the capacitor region of the memory cell array. Thereafter, a lower electrode 403 serving as a capacitor node is patterned. The lower electrode 403 is formed of, e.g., Pt, Ru, SRO($SrRuO_3$) or the like. Then, a BSTO(($Ba, Sr)TiO_3$) film having a thickness of 0.3 to 0.4 nm, when being converted as an oxide film, is deposited on the whole surface as a capacitor insulator film 404, and an upper electrode 405 serving as a plate electrode is deposited thereon. The upper electrode 405 is formed of Pt, Ru, SRO or the like. Thus, a capacitor MC arranged on the bit line BL is prepared.

In the above described memory cell producing process, as shown in FIG. 6, a MOS transistor Q is formed in the electric fuse circuit region at the same time that a MOS transistor MT is formed in the memory cell array region, and an anti-fuse F2 of a capacitor structure, which has a lower electrode 403a, a capacitor insulator film 404a and an upper electrode 405a and which is a kind of an electric fuse, is formed of the same material as that of the capacitor MC at the same time that the capacitor MC is formed.

Then, as shown in FIG. 6, a first layer wiring element 27 is formed on the capacitor MC via the interlayer insulator film 25, and a second layer wiring element 28 is formed thereon via the interlayer insulator film 26. In this preferred embodiment, the second layer wiring element 28 is the uppermost layer wiring element.

In the electric fuse circuit region, a first layer wiring element 27a contacts the upper electrode 405 of the anti-fuse F2. The first layer wiring element 27a is connected to a programming circuit (not shown). The programming circuit carries out a processing for selectively short-circuiting the anti-fuse F2, i.e., for programming the anti-fuse F2 by applying a voltage higher than the power supply Vcc. In the RIE fuse circuit region, a RIE fuse F1 comprised of wiring elements 28a is patterned using the same material as that of the second layer wiring element 28 at the same time that the second layer wiring element 28 are formed.

Figure 9:
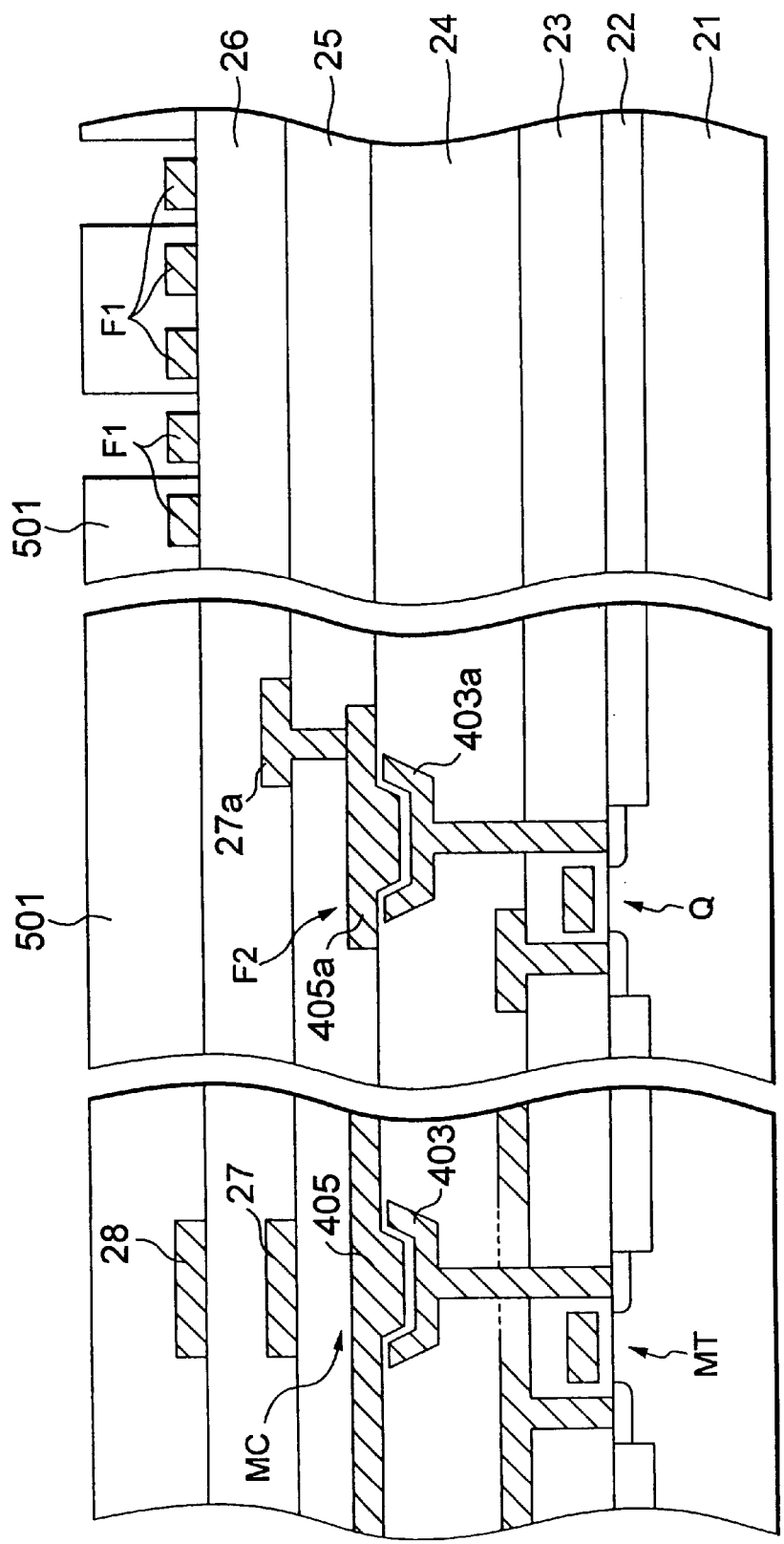
FIG. 9 is a sectional view showing a programming step for a RIE fuse circuit of a semiconductor memory device according to the present invention.

As shown in FIG. 5, in this preferred embodiment, after the uppermost wiring forming step (S1), the die sort test for each of the DRAMs is carried out in the state of the wafer including the plurality of DRAMs (S2). Then, on the basis of defective address data obtained by the first die sort test, the cutting, i.e., the programming, for the RIE fuse F1 is carried out. Specifically, as shown in FIG. 9, a resist 501 is applied so as to cover the uppermost layer wiring element to pattern and form an opening used for programming the RIE fuse F1. As shown in FIG. 5, the lithography step for this resist is carried out by preparing fuse mask data on the basis of the test data (S3) and carrying out the direct writing on the basis of the fuse mask data (S4).

Figure 10:
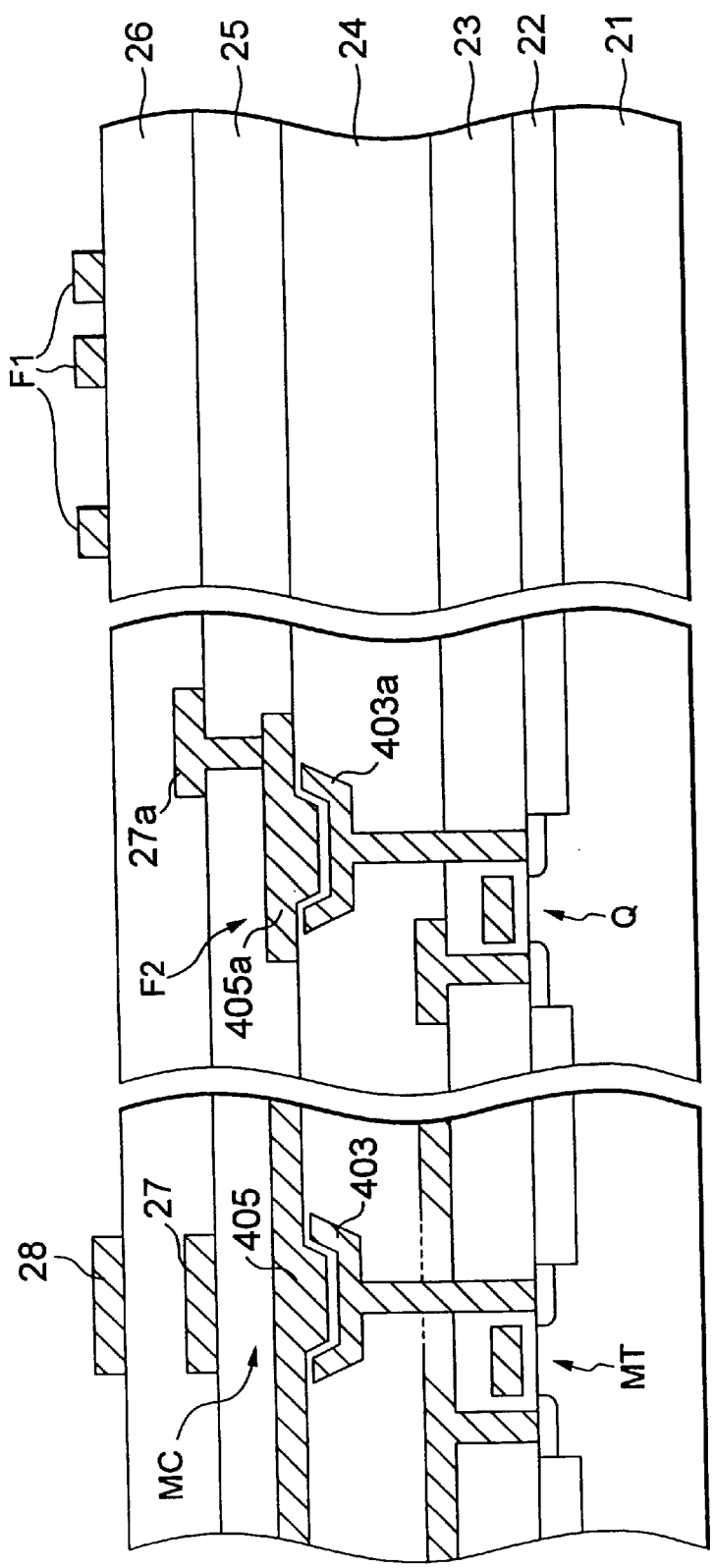
FIG. 10 is a sectional view after the programming step for the RIE fuse circuit of a semiconductor memory device according to the present invention.

When the pitch of the RIE fuse F1 is a fine pitch of a sub-micron, the direct writing is preferably carried out using an electron beam writing system. However, a light beam writing system may be used in accordance with the pitch of the fuse F1. Then, the exposed RIE fuse F1 is etched and cut by the RIE to remove the resist 501 as shown in FIG. 10.

The defective address data obtained by the die sort test are different every chip. Therefore, the mask for exposure used for cutting the RIE fuse is usually required every chip. However, according to the present invention, the RIE fuse is cut by the direct writing, so that the mask for exposure is not required every chip. Therefore, it is possible to suppress the decrease of the throughput.

As described above, in this preferred embodiment, the uppermost wiring material is used directly as the RIE fuse to program the fuse circuit by the RIE. Since the RIE fuse can be formed by a fine pitch in accordance with the design rule of the memory cell array, the scale of the DRAM is large. In addition, even if the scale of the defective address memory circuit is large, the area occupied by the RIE fuse circuit is smaller than the area occupied by the fuse circuit prepared by the usual laser blow.

In addition, since the plurality of fuses to be cut can be simultaneously cut by the RIE unlike a case where a laser blowing machine for cutting the fuses one by one is used, it is possible to obtain a high processing efficiency even if the number of fuses is large. Moreover, the step of programming the RIE fuse circuit becomes simple by preparing the fuse mask data on the basis of the test data and carrying out the lithography on the basis of the fuse mask data using the direct writing system.

Figure 11:
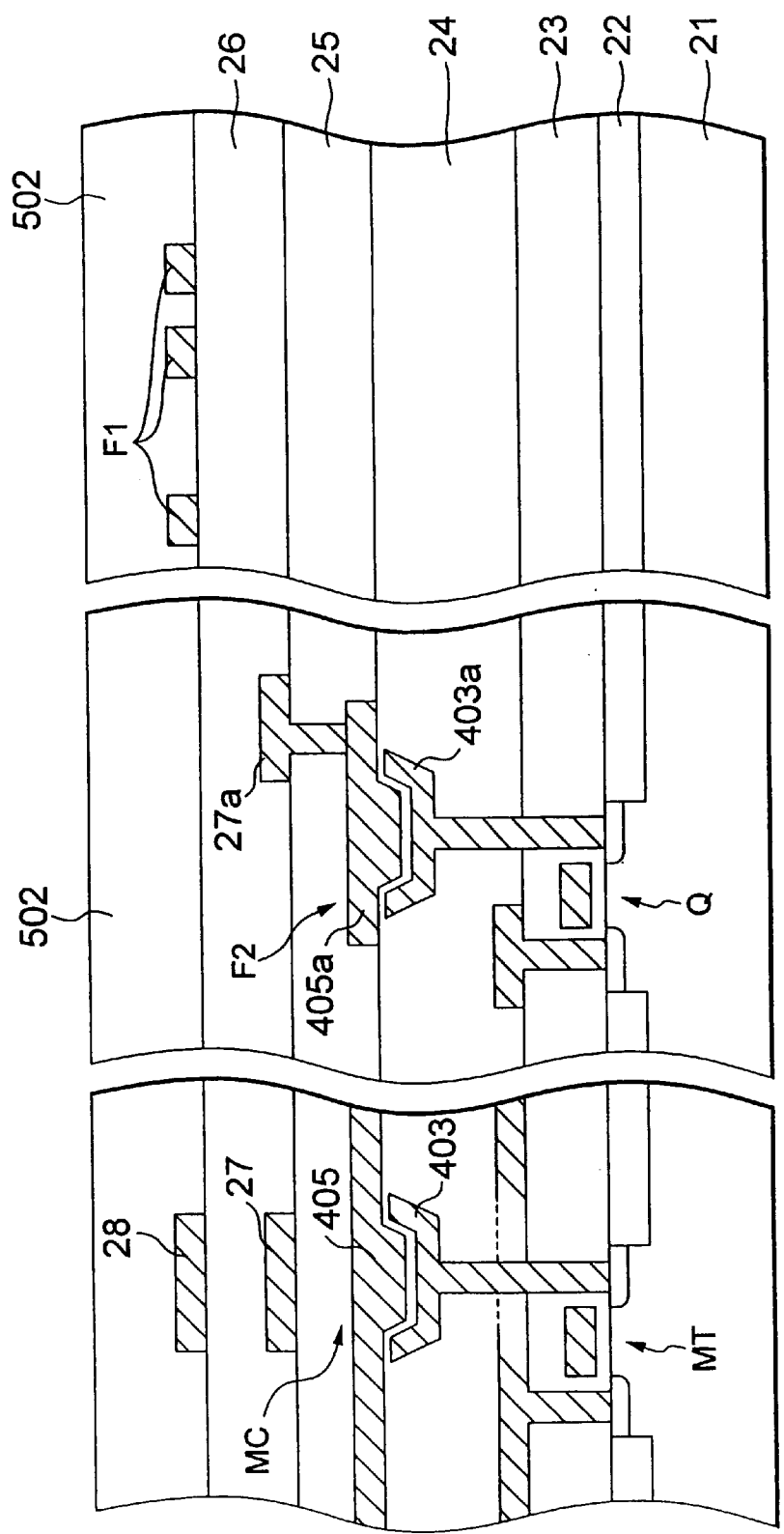
FIG. 11 is a sectional view showing a programming step for an electric fuse of a semiconductor memory device according to the present invention.

After the programming of the RIE fuse circuit is completed, a passivation step (S6) is carried out to deposit a passivation film 502 for covering the uppermost wiring element as shown in FIG. 11. Then, a pad opening (not shown) is formed in the passivation film 502 (S7), and thereafter, the wafer is divided into DRAM chips (S8).

Each of the divided DRAM chips is mounted on a package (S9). In this state, a die sort test is carried out again (S10). Although the defect relief is carried out by programming the RIE fuse circuit on the basis of the die sort in the wafer state as described above, there is some possibility that a memory cell, which has not been determined to be defective in the last die sort test, may be defective after the subsequent passivation step (S6) and pad forming step (S7). For that reason, the die sort test is carried out again. Specifically, it is considered that defect may occur under the influence of the heating step of depositing the passivation film, or due to damage during forming the pad opening, misprocess or the like.

A processing (S11) for selectively short-circuiting the anti-fuse F2, i.e., for programming the electric fuse circuit, is carried out by supplying an electric signal to the defective cell, which has been found by the second die sort test, via the pad opening (not shown). The lower electrode 403a of the anti-fuse F2 is connected to the diffusion layer of the MOS transistor Q. Therefore, the anti-fuse F2 can be short-circuited by applying a voltage to between the upper electrode 405a of the anti-fuse F2 and the terminal of the corresponding MOS transistor Q.

A non-defective DRAM, the defect of which has been relieved, is tested by the final die sort to be a final product (S12).

Furthermore, in the electric fuse circuit, a usual fuse, which is broken to be in a conducting state when a high voltage is applied thereto, may be substituted for the anti-fuse F2.

As described above, in this preferred embodiment, a larger number of defective cells can be relieved by the RIE fuse circuit, and a defective cell, which is produced thereafter, can be relieved by the electric fuse circuit. Therefore, it is possible to obtain a high defect relief efficiency. In addition, as described above, if a principal part of the defective address memory circuit is the RIE fuse circuit, the area occupied by the defective address memory circuit can be small even in the case of a large scale DRAM.

The probability that a defect will be found by the second die sort should be far smaller than the probability that a defect will be found by the first die sort. Therefore, the electric fuse circuit is auxiliary, and the number of fuses thereof may be small, so that the area occupied by the defective address memory circuit can be small. Therefore, the construction of the surrounding electric circuits is not complicated unlike a case where all of the defective address memory circuits are formed by electric fuses.

Moreover, since all of the fuse circuits are formed below the passivation film in this preferred embodiment, there is no problem in that the fuse circuit is exposed to atmosphere to be corroded, so that the reliability thereof is high.

The present invention should not be limited to the above described preferred embodiment. For example, while the DRAM having memory cells of the stacked capacitor structure, wherein the capacitors have been formed on the bit lines, have been described in the preferred embodiment, the present invention may be applied to a DRAM having the stacked capacitor structure wherein capacitors are formed below bit lines.

In addition, while the anti-fuse, which has been formed of the same material and had the same structure as those of the capacitor of the memory cell, has been used as the electric fuse in the preferred embodiment, another type of electric fuse, e.g., a fuse, which is fused when a current passes therethrough, may be used. Also in this case, the electric fuse may be formed of any one of wiring materials which are used in the DRAM process. Moreover, when an electric fuse of this type is used, the DRAM may have the trench capacitor structure.

Moreover, while the fuse capable of being cut by the RIE has been used as the mechanical fuse in the preferred embodiment, a fuse capable of being cut by the wet etching may be used.

In addition, the present invention may be applied to various semiconductor memory devices other than DRAMs as long as the semiconductor memory devices adopt the redundant circuit system.

As described above, according to the present invention, the defective address memory circuit comprises two kinds of memory circuits using different programming methods, so that it is possible to provide a semiconductor memory device capable of decreasing the area occupied by the defective address memory circuit as well as surely carrying out defect relief.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a semiconductor memory device, said method comprising:

a memory producing step of integrating and forming a memory circuit having a defective address memory circuit, which includes a first fuse circuit wherein mechanical fuses capable of being cut by a reactive ion etching are arranged, and a second fuse circuit wherein electric fuses capable of electrically cut or short-circuited are arranged;

a first programming step of carrying out a first defect analyzing test for said memory circuit and selectively cutting a corresponding fuse of said first fuse circuit by the reactive ion etching in accordance with the result of said first defect analyzing test; and a second programming step of carrying out a second defect analyzing test for said memory circuit and selectively cutting or short-circuiting a corresponding fuse of said second fuse circuit by applying an electric signal thereto in accordance with the result of said second defect analyzing test.

2. A method for producing a semiconductor memory device as set forth in claim 1, wherein said first fuse circuit is formed below a passivation film of a semiconductor wafer, on which said memory circuit is formed, and wherein said first programming step is carried out before forming said passivation film.

3. A method for producing a semiconductor memory device as set forth in claim 2, wherein said first programming step comprises the steps of:

patterning and forming a resist on a surface, on which said first fuse circuit of said semiconductor wafer is formed, by a lithography using the direct writing; and selectively etching a corresponding fuse of said first fuse circuit by a reactive ion etching using said patterned and formed resist as a mask.

4. A method for producing a semiconductor memory device as set forth in claim 1, wherein said second programming step is carried out after said memory circuit is divided into chips to be mounted on packages.

* * * * *